(12) United States Patent
Yoshiura et al.

(10) Patent No.: US 9,704,946 B2
(45) Date of Patent: Jul. 11, 2017

(54) SEMICONDUCTOR DEVICE INCLUDING A DIODE AND GUARD RING

(71) Applicant: MITSUBISHI ELECTRIC CORPORATION, Chiyoda-ku (JP)

(72) Inventors: Yasuhiro Yoshiura, Chiyoda-ku (JP); Masanori Inoue, Chiyoda-ku (JP)

(73) Assignee: MITSUBISHI ELECTRIC CORPORATION, Chiyoda-ku (JP)

(*) Notice: Subject to any disclaimer, the term of this patent is extended or adjusted under 35 U.S.C. 154(b) by 0 days.

(21) Appl. No.: 14/705,647

(22) Filed: May 6, 2015

(65) Prior Publication Data

US 2015/0236088 A1     Aug. 20, 2015

Related U.S. Application Data

(62) Division of application No. 12/188,497, filed on Aug. 8, 2008, now abandoned.

(30) Foreign Application Priority Data

May 23, 2008 (JP) ................. 2008-135851

(51) Int. Cl.
*H01L 29/02* (2006.01)
*H01L 29/06* (2006.01)
(Continued)

(52) U.S. Cl.
CPC ...... *H01L 29/0619* (2013.01); *H01L 29/0834* (2013.01); *H01L 29/1016* (2013.01);
(Continued)

(58) Field of Classification Search
CPC ............... H01L 29/0619; H01L 29/861; H01L 29/0834; H01L 2924/00; H01L 2924/0002;
(Continued)

(56) References Cited

U.S. PATENT DOCUMENTS

| 4,150,391 A | 4/1979 | Jaecklin |
| 4,377,816 A | 3/1983 | Sittig |
(Continued)

FOREIGN PATENT DOCUMENTS

| DE | 42 36 557 A1 | 5/1994 |
| DE | 103 24 100 A1 | 12/2004 |
(Continued)

OTHER PUBLICATIONS

Chinese Office Action dated Jan. 31, 2012 in Chinese Patent Application No. 200810182375.9 (with English Translation).
(Continued)

*Primary Examiner* — David Chen
(74) *Attorney, Agent, or Firm* — Oblon, McClelland, Maier & Neustadt, L.L.P.

(57) ABSTRACT

A semiconductor device is provided. On one main surface side of an n-type semiconductor substrate, a p-type diffusion region to serve as an anode of a diode is formed. A guard ring formed of a p-type diffusion region is formed to surround the anode. On the other main surface side, an n-type ultrahigh-concentration impurity layer and an n-type high-concentration impurity layer to serve as a cathode are formed. In a guard-ring opposed region located in the cathode and opposite to the guard ring, a cathode-side p-type diffusion region is formed. Accordingly, concentration of the electric current on an outer peripheral end portion of the anode is suppressed.

3 Claims, 15 Drawing Sheets

(51) Int. Cl.
  *H01L 29/861* (2006.01)
  *H01L 29/08* (2006.01)
  *H01L 29/10* (2006.01)
  *H01L 29/78* (2006.01)
  *H01L 29/74* (2006.01)

(52) U.S. Cl.
  CPC .......... *H01L 29/74* (2013.01); *H01L 29/7811* (2013.01); *H01L 29/861* (2013.01)

(58) Field of Classification Search
  CPC ............. H01L 29/7395; H01L 29/0615; H01L 29/8611; H01L 29/0623; H01L 29/7811; H01L 27/0664; H01L 2924/1301; H01L 29/1016; H01L 29/74
  USPC .................. 257/170, 495, E29.013, E29.198
  See application file for complete search history.

(56) References Cited

U.S. PATENT DOCUMENTS

| | | | |
|---|---|---|---|
| 5,162,876 A | | 11/1992 | Kitagawa et al. |
| 5,859,446 A | * | 1/1999 | Nagasu ............... H01L 29/8611 257/104 |
| 6,323,509 B1 | | 11/2001 | Kusunoki |
| 6,407,413 B1 | | 6/2002 | Kawamoto |
| 6,583,496 B2 | | 6/2003 | Galtie et al. |
| 7,259,440 B2 | | 8/2007 | Kelberlau |
| 2002/0030199 A1 | | 3/2002 | Hirano et al. |
| 2002/0047124 A1 | | 4/2002 | Kitabatake |
| 2004/0183092 A1 | * | 9/2004 | Yamaguchi et al. .......... 257/107 |
| 2005/0161746 A1 | * | 7/2005 | Mauder ............... H01L 29/0834 257/370 |
| 2007/0158680 A1 | * | 7/2007 | Ozeki ............... H01L 27/0664 257/146 |
| 2007/0200138 A1 | | 8/2007 | Ozeki et al. |
| 2007/0215898 A1 | * | 9/2007 | Ozeki ................ H01L 29/7397 257/139 |
| 2008/0001159 A1 | * | 1/2008 | Ota ....................... H01L 29/872 257/77 |
| 2009/0267200 A1 | * | 10/2009 | Gutt ................ H01L 21/26513 257/655 |

FOREIGN PATENT DOCUMENTS

| | | |
|---|---|---|
| DE | 10 2007 026 387 A1 | 4/2008 |
| EP | 1 909 332 A1 | 4/2008 |
| JP | 3-145161 | 6/1991 |
| JP | 7-193080 | 7/1995 |
| JP | 9-232597 | 9/1997 |
| JP | 9-246570 | 9/1997 |
| JP | 2000-208529 | 7/2000 |
| JP | 2003-152197 | 5/2003 |
| JP | 2004-22743 | 1/2004 |
| JP | 2005-57235 | 3/2005 |
| JP | 2007-103770 | 4/2007 |
| KR | 2001-0077891 | 8/2001 |
| TW | 1226709 | 1/2005 |
| WO | WO 2008/040733 A1 | 4/2008 |

OTHER PUBLICATIONS

Taiwanese Office Action dated Jan. 9, 2012 in Taiwanese Patent Application No. 097130032 (with English Translation).
Office Action issued Jan. 13, 2011, in German Patent Application No. 10 2008 051 166.8-33 (with English-language Translation).
Office Action issued Oct. 26, 2010, in Japanese Patent Application No. 2008-135851 with English translation.

* cited by examiner

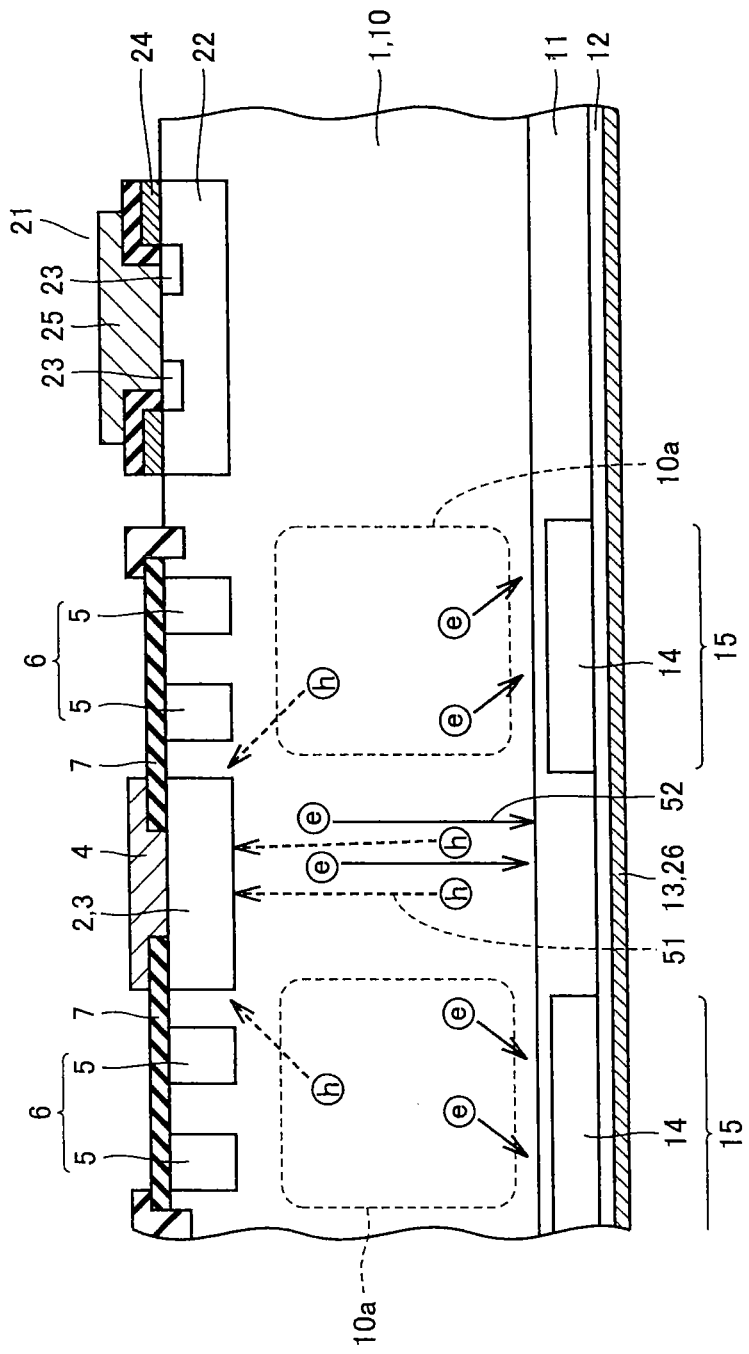

SEMICONDUCTOR DEVICE INCLUDING A DIODE AND GUARD RING

CROSS-REFERENCE TO RELATED APPLICATIONS

The present application is a divisional of U.S. application Ser. No. 12/188,497 filed Aug. 8, 2008, and claims priority to JP 2008-135851 filed May 23, 2008, the entire contents of each of which are incorporated herein by reference.

BACKGROUND OF THE INVENTION

Field of the Invention

The present invention relates to a semiconductor device, and particularly to a high-withstand-voltage semiconductor device including a diode and for use in electric-power applications.

Description of the Background Art

In these years, inverters are used in those fields such as the field of industrial power units. For the inverter, usually a commercial power source (AC power source) is used. Thus, the inverter includes a converter unit first converting an AC voltage into a DC voltage (forward conversion), a smoothing circuit unit and an inverter unit converting the DC voltage into an AC voltage (inverse conversion). As a main power device of the inverter unit, an insulated gate bipolar transistor (hereinafter referred to as "IGBT") capable of performing switching operation at a relatively high speed is chiefly employed.

In most cases, the load of the inverter is an electric induction machine (motor which is an inductive load). The inductive load is connected to a point of an intermediate potential between an upper arm element and a lower arm element, and electric current flows to the inductive load in both of the positive and negative directions. Therefore, in order to direct the current flowing in the inductive load from the end where the load is connected back to the power supply of a high potential and to direct the current from the end where the load is connected to the ground, a freewheel diode for circulating the current between the inductive load and the closed circuit of the arm elements is necessary.

In the inverter, usually the IGBT is operated as a switch to repeat the OFF state and the ON state so as to control the power energy. Regarding the switching of the inverter circuit with an inductive load, the ON state is reached through a turn-on process while the OFF state is reached through a turn-off process. Here, the turn-on process refers to a change of the IGBT from the OFF state to the ON state while the turn-off process refers to a change of the IGBT from the ON state to the OFF state. While the IGBT is in the ON state, current does not flow through the diode and the diode is in the OFF state. In contrast, while the IGBT is in the OFF state, current flows through the diode and the diode is in the ON state.

A structure and an operation of a conventional diode will be described. In the conventional diode, a p-type diffusion region to serve as an anode is formed on one main surface side of an n-type low-concentration semiconductor substrate. On the p-type diffusion region, an anode electrode is formed such that the anode electrode contacts the p-type diffusion region. On the other main surface side of the semiconductor substrate, an n-type ultrahigh-concentration impurity layer is formed as the topmost surface. Under the n-type ultrahigh-concentration impurity layer, an n-type high-concentration impurity layer is formed. On the n-type ultrahigh-concentration impurity layer, a cathode electrode is formed such that the cathode electrode contacts the n-type ultrahigh-concentration impurity layer.

In order to ensure a withstand voltage of the diode in the state where a voltage is applied between the cathode electrode and the anode electrode, the diode including a guard ring (p-type layer) is commonly and widely used. The guard ring is formed to surround the anode at a distance from an end of the anode (p-type diffusion region), so that the electric field on an outer peripheral end portion of the p-type diffusion region is alleviated.

In an ON state where a high voltage is applied in the forward direction between the anode and the cathode, a large number of carriers are accumulated in a first-conductivity-type region (drift layer) of the semiconductor substrate. In contrast, in an OFF state where a high voltage is applied in the reverse direction between the anode and the cathode (at the time of reverse recovery), the carriers accumulated in the drift layer are discharged so that a reverse recovery current flows. At this time, a large current and a large voltage are applied to the diode, and accordingly heat is generated which is accompanied by large power consumption. This is one of the causes of hindrance to fast switching.

Japanese Patent Laying-Open Nos. 2003-152197 and 09-246570 for example disclose a diode including a guard ring.

The conventional semiconductor device has the following problem. In the ON state of the diode, carriers are diffused and accumulated not only in a region of the drift layer that is located immediately under the anode but also a region of the drift layer that is located immediately under the guard ring.

In the OFF state, carriers accumulated in the drift layer are discharged from the anode or cathode, for example, and disappear in the end. At this time, into the p-type diffusion region of the anode, both of carriers (holes) accumulated in the region of the drift layer immediately under the anode and carriers (holes) accumulated in the region of the drift layer immediately under the guard ring flow. Therefore, particularly in an outer peripheral end portion of the anode located in close proximity to the guard ring, current concentration occurs. Further, in the outer peripheral end portion of the anode, the electric field is intense at the time of reverse bias. Thus, the electric current and the electric field act on the outer peripheral end portion of the anode, and the outer peripheral end portion is a portion that is most likely to be broken in a marginal test.

SUMMARY OF THE INVENTION

The present invention has been made for solving the above-described problem, and an object of the invention is to provide a semiconductor device in which current concentration on an outer peripheral end portion of the anode is suppressed.

A semiconductor device according to the present invention has a diode, and includes a semiconductor substrate of a first conductivity type, an anode of a second conductivity type, a guard ring, a cathode of the first conductivity type, and a cathode-side impurity region of the second conductivity type. The semiconductor substrate of the first conductivity type has a first main surface and a second main surface opposite to each other. The anode of the second conductivity type is formed on a first main surface side of the semiconductor substrate. The guard ring is formed at a distance from the anode and surrounds the anode. The cathode of the first conductivity type is formed on a second main surface side of the semiconductor substrate. The cathode-side impurity region of the second conductivity type is formed in a region located in the cathode and opposite to the guard ring.

In the semiconductor device of the present invention, the cathode-side impurity region of the second conductivity type is formed in the region in the cathode that is opposite to the guard ring, so that the volume of the n-type region of the cathode is decreased and accordingly the carriers accumulated in the region of the first conductivity type of the semiconductor substrate that is located immediately under the guard ring can be reduced in the ON state. Thus, carriers flowing from the region of the first conductivity type immediately under the guard ring into an outer peripheral end portion of the anode in close proximity to the guard ring decrease at the time when a change from the ON state to the OFF state occurs. As a result, concentration of the current on the outer peripheral end portion of the anode is suppressed and thus the breakdown tolerance can be improved.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 26 and 27 are cross sections respectively showing a first state and a second state for illustrating an operation of the semiconductor device in the embodiment.

DESCRIPTION OF THE PREFERRED EMBODIMENTS

First Embodiment

Figure 1:
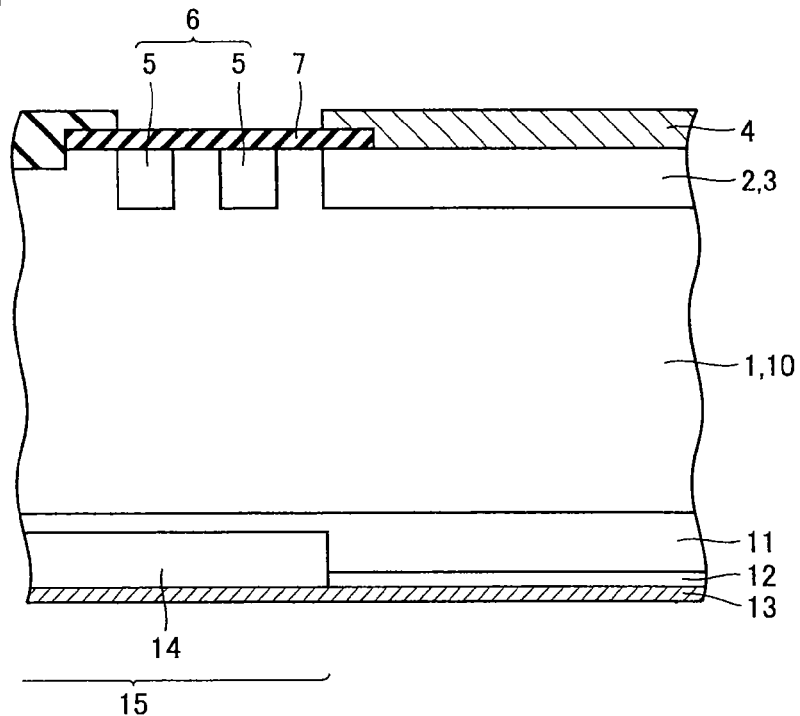
FIG. 1 is a cross section of a semiconductor device according to a first embodiment of the present invention.

A description will be given of a semiconductor device including a diode, according to a first embodiment of the present invention. As shown in FIG. 1, an anode 2 of the diode is formed on one main surface side of an n-type semiconductor substrate 1, and a cathode is formed on the other main surface side.

A p-type diffusion region 3 is formed to serve as anode 2. P-type diffusion region 3 is formed to a predetermined depth from the main surface of semiconductor substrate 1. The impurity concentration of p-type diffusion region 3 is approximately $1\times10^{16-18}$ ions/cm$^3$. On p-type diffusion region 3, an anode electrode 4 is formed. A guard ring 6 formed of a p-type diffusion region 5 is formed at a distance from anode 2 to surround anode 2. P-type diffusion region 5 is formed to a predetermined depth from the main surface of semiconductor substrate 1. On guard ring 6, an insulating film 7 is formed to cover guard ring 6.

An n-type ultrahigh-concentration impurity layer 12 and an n-type high-concentration impurity layer 11 are formed to serve as the cathode. The impurity concentration of n-type ultrahigh-concentration impurity layer 12 is approximately $1\times10^{19-21}$ ions/cm$^3$, and the impurity concentration of n-type high-concentration impurity layer 11 is approximately $1\times10^{14-19}$ ions/cm$^3$. N-type ultrahigh-concentration impurity layer 12 is formed to a predetermined depth from the other main surface of semiconductor substrate 1, and n-type high-concentration impurity layer 11 is formed subsequently to n-type ultrahigh-concentration impurity layer 12 to a greater depth. In the cathode, a cathode-side p-type diffusion region 14 is formed in a guard-ring opposed region 15 which is located opposite to guard ring 6. A cathode electrode 13 is formed to contact cathode-side p-type diffusion region 14 and n-type ultrahigh-concentration impurity layer 12.

An operation of the above-described semiconductor device will now be described. A diode in an inverter circuit alternates between an ON state and an OFF state according to a switching operation of an IGBT. When the IGBT is in the ON state, the diode is in the OFF state. When the IGBT is in the OFF state, the diode is in the ON state.

Figure 2:
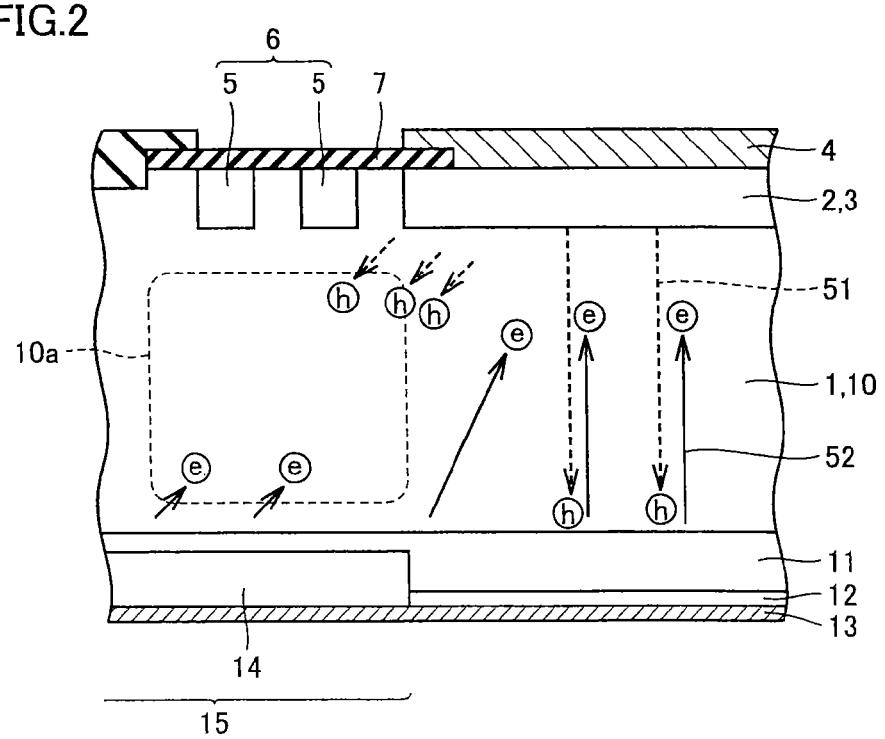
FIGS. 2 and 3 are cross sections respectively showing a first state and a second state for illustrating an operation of the semiconductor device in the embodiment.

In the ON state of the diode where a high voltage is applied in the forward direction between anode electrode 4 and cathode electrode 13, a large number of carriers are accumulated in a first-conductivity-type region (hereinafter referred to as "drift layer 10") of semiconductor substrate 1 as shown in FIG. 2. Specifically, holes are injected from p-type diffusion region 3 toward drift layer 10 of semiconductor substrate 1, while electrons are injected from n-type ultrahigh-concentration impurity layer 12 and n-type high-concentration impurity layer 11 toward drift layer 10 of semiconductor substrate 1.

Figure 3:
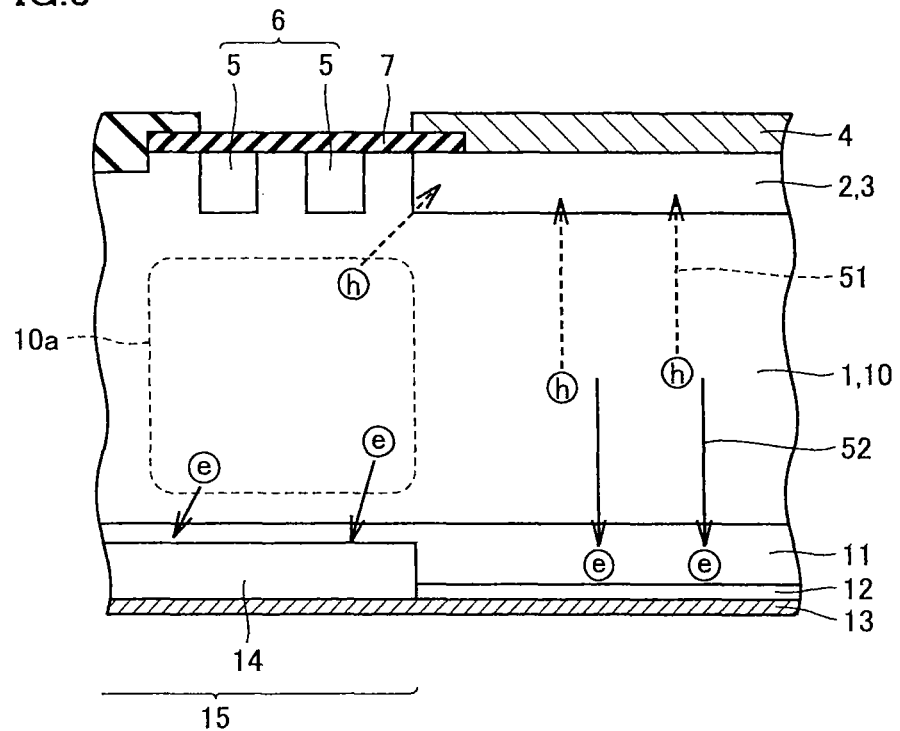

Then, subsequently to the ON state, a high voltage is applied in the reverse direction between anode electrode 4 and cathode electrode 13 of the diode, so that the diode changes to the OFF state. As shown in FIG. 3, at the OFF time when the diode changes from the ON state to the OFF state, from the carriers accumulated in drift layer 10 in the ON state, electrons are discharged from cathode electrode 13 and holes are discharged from anode electrode 4. A part of the electrons and holes are recombined to disappear, and the injected carriers disappear in the end.

In the above-described semiconductor device, cathode-side p-type diffusion region 14 is formed in guard-ring opposed region 15 located in the cathode (n-type ultrahigh-concentration impurity layer 12 and n-type high-concentration impurity layer 11) and located opposite to the guard ring. Thus, the volume (electron concentration) of the n-type region is decreased and consequently an electric field concentration on an outer peripheral end portion of the anode at the OFF time can be alleviated. This will be described in connection with a semiconductor device of a comparative example without the p-type diffusion region on the cathode side.

The semiconductor device of the comparative example has the same structure as that of the above-described semiconductor device except that the former semiconductor device does not have the p-type diffusion region formed on the cathode side. Specifically, as shown in FIG. 4, a p-type diffusion region 103 to server as an anode 102, an anode electrode 104 and a p-type diffusion region 105 to serve as a guard ring 106 are formed on one main surface side of a semiconductor substrate 101, and an n-type ultrahigh-concentration impurity layer 112 and an n-type high-concentration impurity layer 111 to serve as a cathode and a cathode electrode 113 are formed on the other main surface side.

Figure 4:
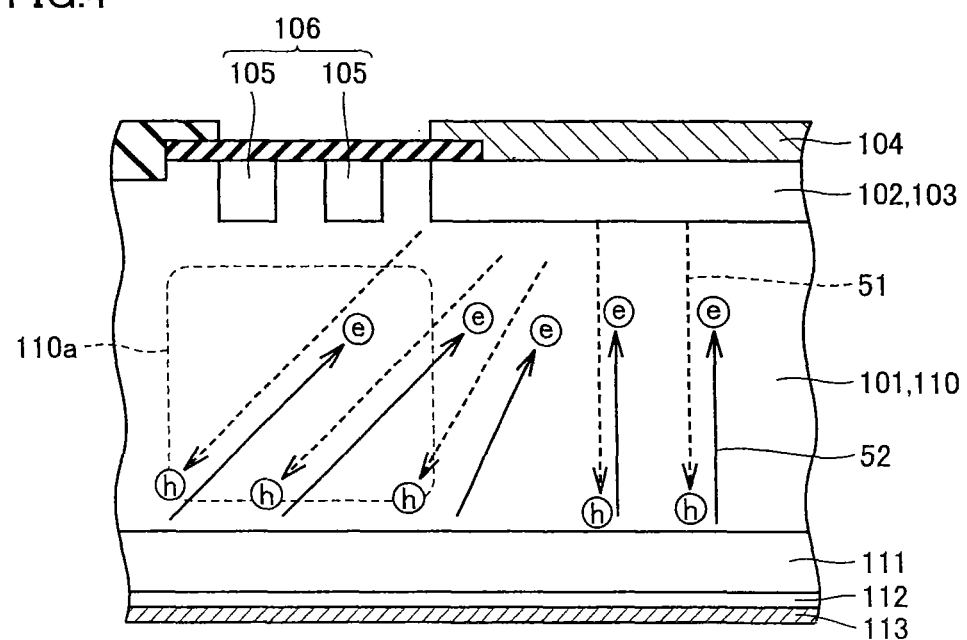
FIGS. 4 and 5 are cross sections of a semiconductor device according to a comparative example, showing a first state and a second state respectively for illustrating an operation of the semiconductor device.

As shown in FIG. 4, in the ON state of the diode where a high voltage is applied in the forward direction between anode electrode 104 and cathode electrode 113, holes are injected from p-type diffusion region 102 toward an n-type region (drift layer 110) of semiconductor substrate 101, while electrons are injected from n-type ultrahigh-concentration impurity layer 112 and n-type high-concentration impurity layer 111 toward n-type drift layer 110 of semiconductor substrate 101.

In the semiconductor device of the comparative example, the cathode side is occupied by only the n-type region that is n-type ultrahigh-concentration impurity layer 112 and n-type high-concentration impurity layer 111. Therefore, as compared with the case where the p-type region is formed in this n-type region, the n-type region of the comparative example has a larger volume. Particularly in a region 110a of the drift layer that is located immediately under guard ring 106, more carriers (electrons) are injected and accumulated.

Figure 5:
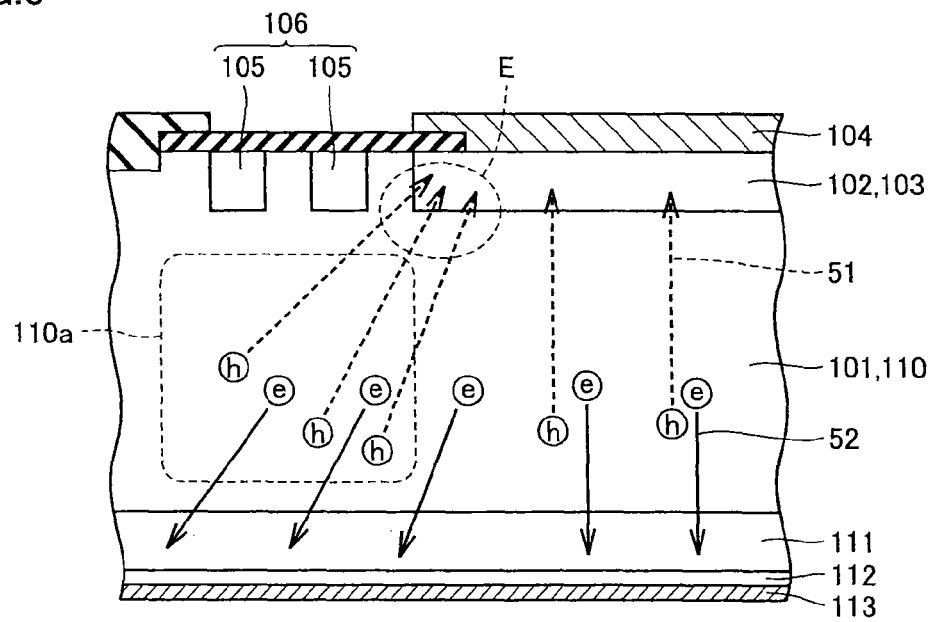

Then, as shown in FIG. 5, subsequently to the ON state, a high voltage is applied in the reverse direction between anode electrode 104 and cathode electrode 113 of the diode, so that the diode changes from the ON state to the OFF state. At this OFF time, from the carriers accumulated in drift layer 110 in the ON state, electrons are discharged from cathode electrode 113 while holes are discharged from anode electrode 104, and accordingly the injected carriers disappear in the end.

At this time, both of the carriers (holes) accumulated in the region of drift layer 110 immediately under anode 102 and the carriers (holes) accumulated in region 110a of drift layer 110 immediately under guard ring 106 flow into p-type diffusion region 103 of anode 102. Therefore, the electric current concentrates particularly on an outer peripheral end portion (the portion encircled by a dotted line E) of p-type diffusion region 103 that is located in close proximity to guard ring 106.

In contrast, in the semiconductor device of the present embodiment, in n-type ultrahigh-concentration impurity layer 12 and n-type high-concentration impurity layer 11 (cathode), cathode-side p-type diffusion region 14 is formed in guard-ring opposed region 15 opposite to guard ring 6. Therefore, the volume (electron concentration) of the n-type region in guard-ring opposed region 15 is decreased. Accordingly, the concentration of carriers (electrons) injected from the cathode into region 10a of the drift layer immediately under guard ring 6 in the ON state decreases, so that the carriers accumulated in region 10a decreases.

Since the carriers accumulated in region 10a of the drift layer immediately under guard ring 6 decreases, the amount of carriers flowing into the outer peripheral end portion of p-type diffusion region 3 that is located in close proximity to guard ring 6 in the OFF state can be decreased. As a result, concentration of the current (reverse recovery current) on the outer peripheral end portion of p-type diffusion region 3 can be suppressed to improve the breakdown tolerance.

Second Embodiment

Figure 6:
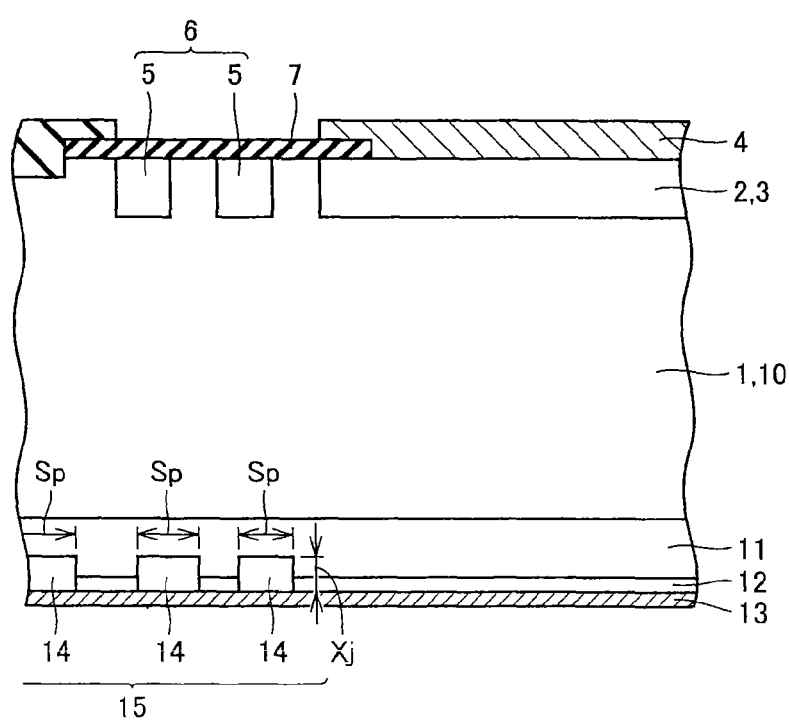
FIG. 6 is a cross section of a semiconductor device according to a second embodiment of the present invention.

A description will be given here of a semiconductor device in which the volume of the cathode-side p-type diffusion region can be adjusted. As shown in FIG. 6, in guard-ring opposed region 15 in the cathode, a plurality of cathode-side p-type diffusion regions 14 each having a width Sp and a depth Xj are formed. This semiconductor device is similar to the semiconductor device shown in FIG. 1 except for this feature. Therefore, like components are denoted by like reference characters and the description thereof will not be repeated.

Figure 7:
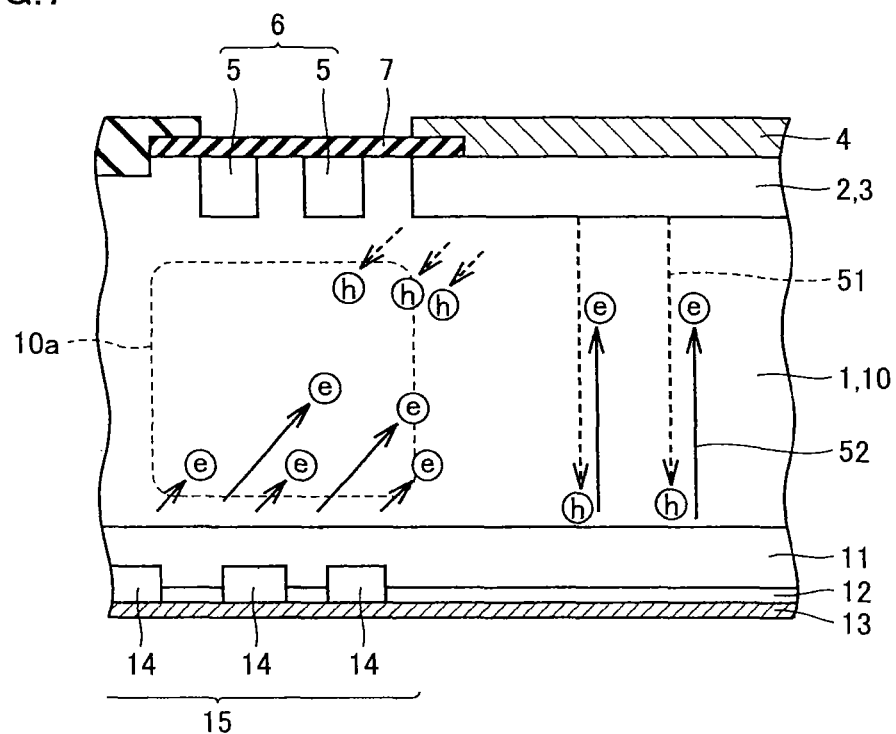
FIGS. 7 and 8 are cross sections respectively showing a first state and a second state for illustrating an operation of the semiconductor device in the embodiment.
Figure 8:
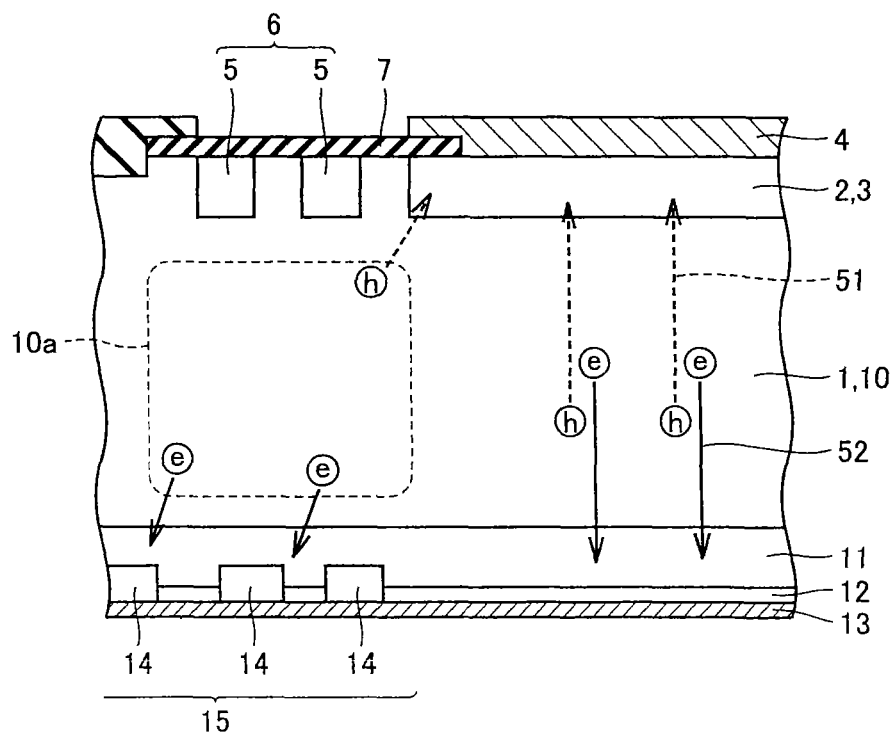

An operation of the above-described semiconductor device will now be described. As shown in FIG. 7, in the ON state of the diode, holes are injected from p-type diffusion region 3 toward drift layer 10 of semiconductor substrate 1, while electrons are injected from n-type ultrahigh-concentration impurity layer 12 and n-type high-concentration impurity layer 11 toward drift layer 10 of semiconductor substrate 1. Then, as shown in FIG. 8, in the OFF state of the diode, from the carriers accumulated in drift layer 10 in the ON state, electrons are discharged from cathode electrode 13 and holes are discharged from anode electrode 4. A part of electrons and holes are recombined to disappear, and the injected carriers disappear in the end.

In the above-described semiconductor device, since cathode-side p-type diffusion regions 14 are formed in guard-ring opposed region 15, the volume (electron concentration) of the n-type region is decreased. Thus, the carriers accumulated in region 10a of the drift layer immediately under guard ring 6 in the ON state can be decreased. Accordingly, at the OFF time when the change from the ON state to the OFF state occurs, the carriers flowing from region 10a of the drift layer immediately under guard ring 6 into an outer peripheral end portion of p-type diffusion region 3 that is located in close proximity to guard ring 6 decrease. As a result, concentration of the current (reverse recovery current) on the outer peripheral end portion of p-type diffusion region 3 can be suppressed to improve the breakdown tolerance.

In particular, for the semiconductor device as described above, a desired depth Xj and a desired width Sp of cathode-side p-type diffusion region 14 formed in guard-ring opposed region 15 can be set based on the tradeoff between a recovery tolerance and a forward voltage drop.

This will be described based on graphs each showing a relation between a recovery loss and a forward voltage drop.

Figure 9:
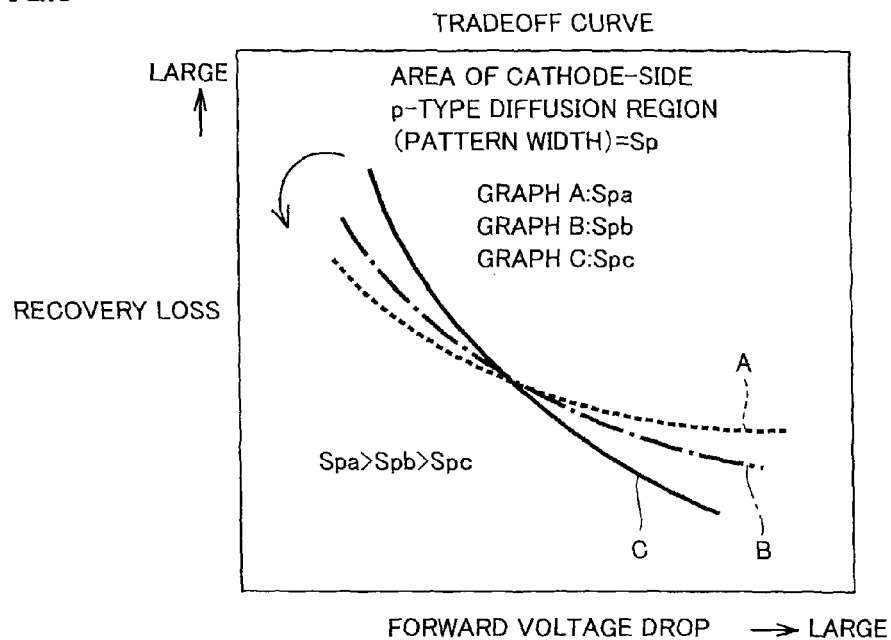
FIGS. 9 and 10 are respectively a first graph and a second graph showing a relation between a recovery loss and a forward voltage drop for illustrating an effect of the semiconductor device in the embodiment.
Figure 10:
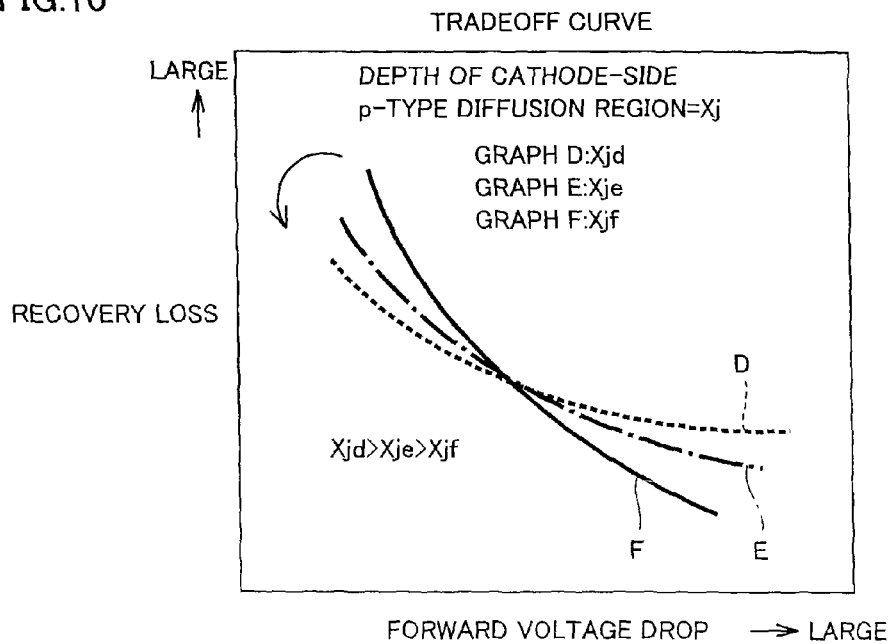

FIGS. 9 and 10 are each a graph showing this relation. FIG. 9 shows graphs A, B and C where respective depths of the cathode-side p-type diffusion regions are identical while three different widths Sp are provided (Spa>Spb>Spc). FIG. 10 shows graphs D, E and F where respective widths of the cathode-side p-type diffusion regions are identical while three different depths are provided (Xjd>Xje>Xjf).

First, in the case as shown in FIG. 9, as width Sp (area) increases while respective depths of the cathode-side p-type diffusion regions are identical, the volume of cathode-side p-type diffusion regions 14 increases. Thus, the volume of the n-type region of the cathode decreases, and carriers accumulated in region 10a of the drift layer immediately under guard ring 6 in the ON state decrease. At the time of the change from the ON state to the OFF state, the time taken for carriers to disappear is shortened, so that the diode changes more speedily to the OFF state.

As width Sp of cathode-side p-type diffusion region 14 increases, carriers accumulated in drift layer 10 in the ON state decrease so that the turn-on resistance increases. Therefore, a difference between a voltage when the current enters the diode and a voltage when the current leaves the diode (forward voltage drop) increases and the recovery loss increases. FIG. 9 shows this by the tendency of the graphs that the right side rises and the left side falls as width Sp is larger.

Figure 11:
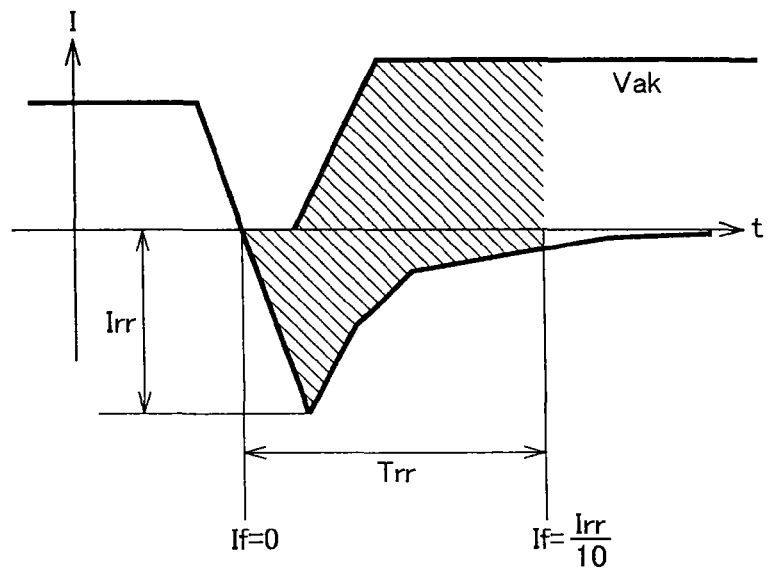
FIG. 11 is a graph showing a reverse recovery current for illustrating a recovery loss in the embodiment.

Here, the recovery loss refers to a loss generated by the flow of a reverse recovery current when a reverse bias voltage is applied to the diode. As shown in FIG. 11, the recovery loss is represented by a product of an integrated value of the current and an integrated value of the voltage from the time when the reverse recovery current starts flowing (If=0), through the time Trr when a maximum value (absolute value) Irr is reached, to the time when the current becomes one-tenth of Irr, and corresponds to the area of the portion indicated by the oblique lines.

Second, in the case as shown in FIG. 10, as depth Xj increases while respective widths of cathode-side p-type diffusion regions 14 are identical, the volume of cathode-side p-type diffusion region 14 increases. Then, the volume of the n-type region of the cathode decreases, and the carriers accumulated in region 10a of the drift layer 10 immediately under guard ring 6 in the ON state decrease. At the time of the change from the ON state to the OFF state, the time required for carriers to disappear is shortened, so that the diode more speedily becomes the OFF state.

As depth Xj of cathode-side p-type diffusion region 14 increases, carriers accumulated in drift layer 10 in the ON state decreases, so that the turn-on resistance increases. Therefore, the forward voltage drop increases and the recovery loss increases. In FIG. 10, this is shown by the tendency that the right side of the graph rises and the left side thereof falls as depth Xj increases.

Namely, as the volume of cathode-side p-type diffusion region 14 of the diode is increased, the speed of the switching of the diode can be increased, while the recovery loss increases. Therefore, more stable switching operation can be achieved by setting depth Xj and width Sp of cathode-side p-type diffusion region 14 to desired values respectively, in terms of the relation with a device to which the diode is applied.

Third Embodiment

Figure 12:
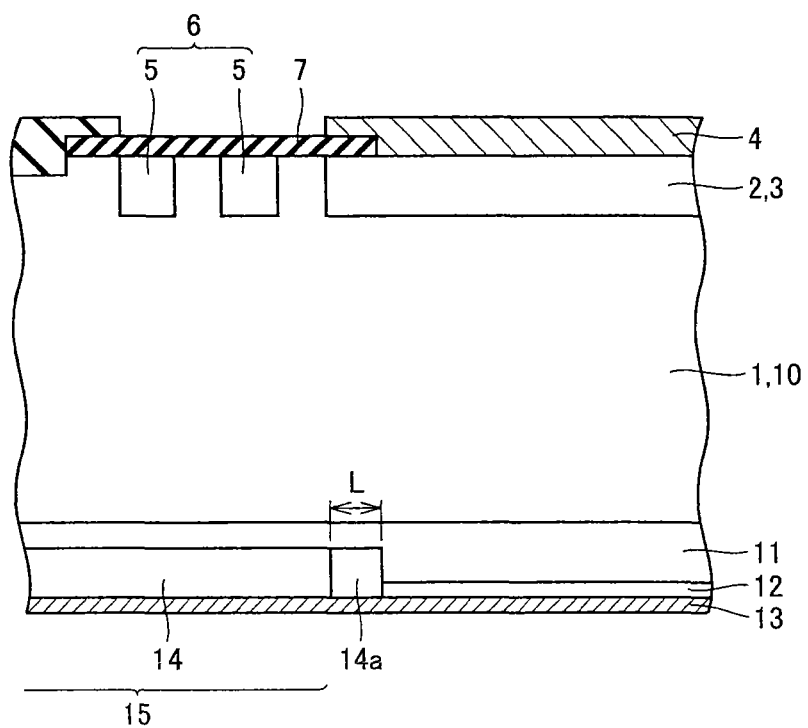
FIG. 12 is a cross section of a semiconductor device according to a third embodiment of the present invention.

A description will be given here of a semiconductor device in which the cathode-side p-type diffusion region is extended to a part of the region opposite to the anode. As shown in FIG. 12, the cathode-side p-type diffusion region includes an extended region 14a extended to a part of the region opposite to the anode. This semiconductor device is similar to the semiconductor device shown in FIG. 1 except for this feature. Therefore, like components are denoted by like reference characters and the description thereof will not be repeated.

Figure 13:
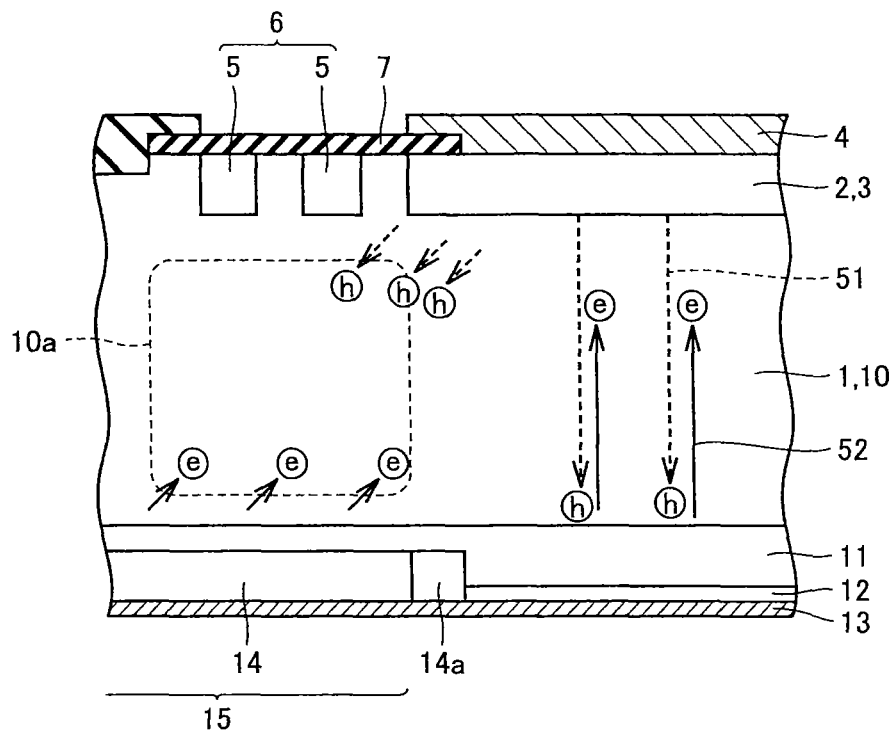
FIGS. 13 and 14 are cross sections respectively showing a first state and a second state for illustrating an operation of the semiconductor device in the embodiment.
Figure 14:
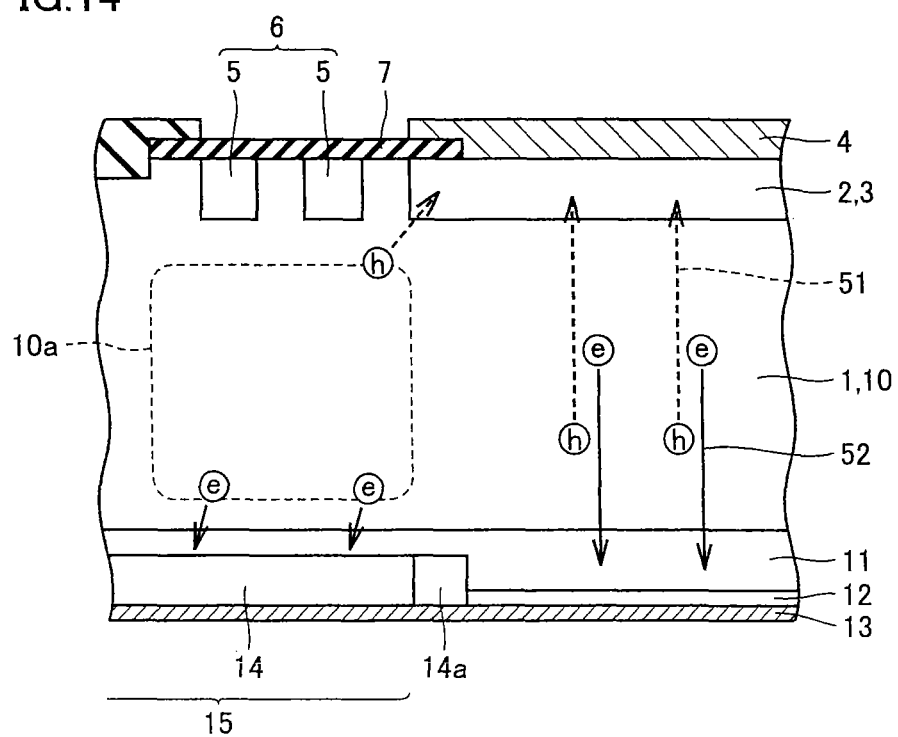

An operation of the above-described semiconductor device will now be described. As shown in FIG. 13, in the ON state of the diode, holes are injected from p-type diffusion region 3 toward drift layer 10 of semiconductor substrate 1, while electrons are injected from n-type ultra-high-concentration impurity layer 12 and n-type high-concentration impurity layer 11 toward drift layer 10 of semiconductor substrate 1. As shown in FIG. 14, at the OFF time, the carriers accumulated in drift layer 10 are discharged from cathode electrode 13 or anode electrode 4, for example, and disappear in the end.

In the above-described semiconductor device, cathode-side p-type diffusion region 14 is formed in guard-ring opposed region 15. Therefore, the volume of the n-type region (electron concentration) is decreased, so that carriers accumulated in region 10a of the drift layer 10 immediately under guard ring 6 in the ON state can be decreased. Accordingly, at the OFF time when a change from the ON state to the OFF state occurs, the carriers flowing from region 10a of the drift layer 10 immediately under guard ring 6 into an outer peripheral end portion of p-type diffusion region 3 in close proximity to guard ring 6 decrease. As a result, concentration of the current (reverse recovery current) on the outer peripheral end portion of p-type diffusion region 3 can be suppressed to improve the breakdown tolerance.

In particular, in the semiconductor device as described above, extended region 14a extended into a part of the region located opposite to the anode is formed. Here, the amount of extension (area or volume) of extended region 14a will be described based on graphs showing a relation between a recovery loss and a forward voltage drop.

Figure 15:
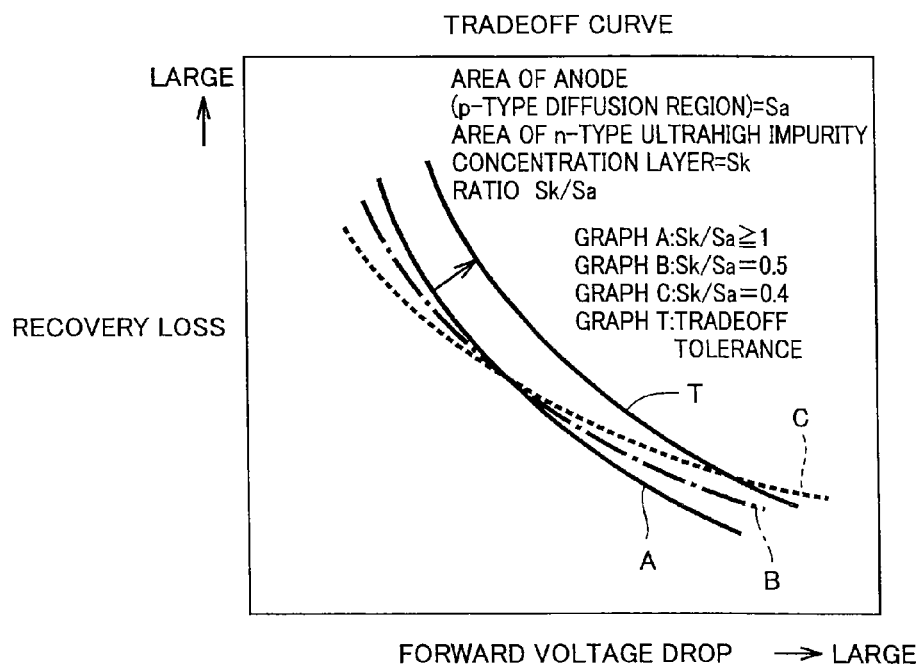
FIG. 15 is a graph showing a relation between a recovery loss and a forward voltage drop for illustrating an effect of the semiconductor device in the embodiment.

FIG. 15 is a graph showing this relation. In particular, graphs A, B and C where the area ratio between an area Sa of the anode and an area Sk of the n-type ultrahigh-concentration impurity layer (area ratio: Sk/Sa) is provided under three conditions (Sk/Sa≥1, Sk/Sa=0.5, Sk/Sa=0.4), as well as a graph T for a tradeoff tolerance value are shown. In any case, the depth of the anode (p-type diffusion region) and the depth of the n-type ultrahigh-concentration impurity layer are constant.

As cathode-side p-type diffusion region 14 is extended gradually to the region opposite to anode 2, area Sk of the n-type ultrahigh-concentration impurity layer decreases and the area ratio decreases. Then, the volume of the n-type region of the cathode decreases. The carriers accumulated in region 10a of the drift layer 10 immediately under guard ring 6 in the ON state decreases. At the OFF time when a change from the ON state to the OFF state occurs, the time consumed by carriers to disappear is shortened, so that the diode becomes the OFF state more speedily.

However, as described above, when the volume of cathode-side p-type diffusion region 14 increases, carriers accumulated in drift layer 10 in the ON state decrease so that the turn-on resistance increases. Therefore, the forward voltage drop increases and the recovery loss increases. FIG. 15 shows this by a tendency of the inclination of the graph that the right side of the graph rises while the left side thereof falls as the area ratio (Sk/Sa) decreases.

Of the three graphs A, B and C shown in FIG. 15, graph C corresponding to the area ratio (Sk/Sa) of 0.4 shows that the recovery loss of the right end portion of graph C is higher than graph T showing the tradeoff tolerance value. It is seen from this that, in order to increase the speed of the switching of the diode and reduce the recovery loss, it is necessary that the area ratio (Sk/Sa) is not 0.5 or less. In other words, the dimension of the extension of extended region 14a of cathode-side p-type diffusion region 14 has to be set less than 50% of area Sa of anode 2 (p-type diffusion region 3).

In this semiconductor device, extended region 14a is provided to cathode-side p type diffusion region 14. Thus, holes are also injected from this extended region 14a and accordingly a variation of the current with respect to the time in a final operation of the recovery can be made gentler. As a result, oscillation of the diode is suppressed, so that breakage of the diode due to the action of a voltage exceeding a tolerance, and generation of noise having an adverse influence on peripherals can be suppressed.

Fourth Embodiment

Figure 16:
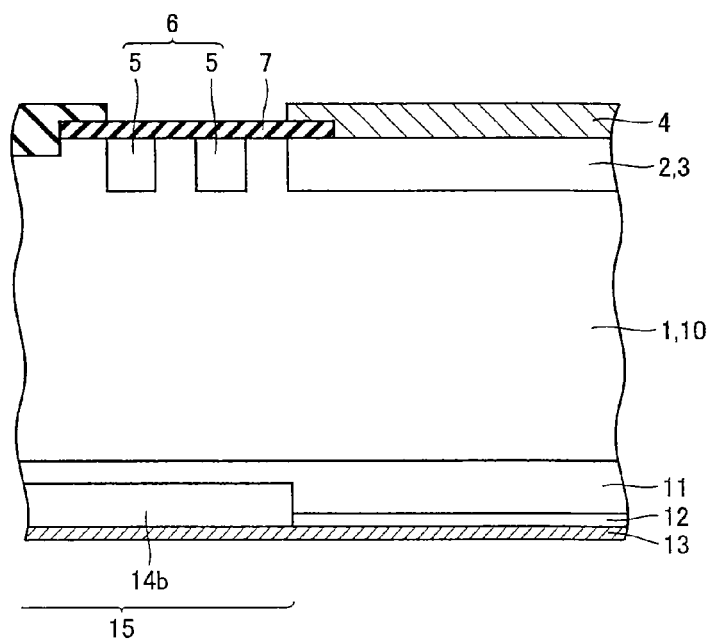
FIG. 16 is a cross section of a semiconductor device according to a fourth embodiment of the present invention.

A description will be given here of an example of the semiconductor device for locally shortening the lifetime of carriers. As shown in FIG. 16, in guard-ring opposed region 15 of the cathode, a cathode-side p-type diffusion region 14b is formed in which a heavy metal (such as Au or Pt) is selectively diffused. This semiconductor device is similar to the semiconductor device shown in FIG. 1 except for the above-described feature. Therefore, like components are denoted by like reference characters and the detailed description thereof will not be repeated.

Figure 17:
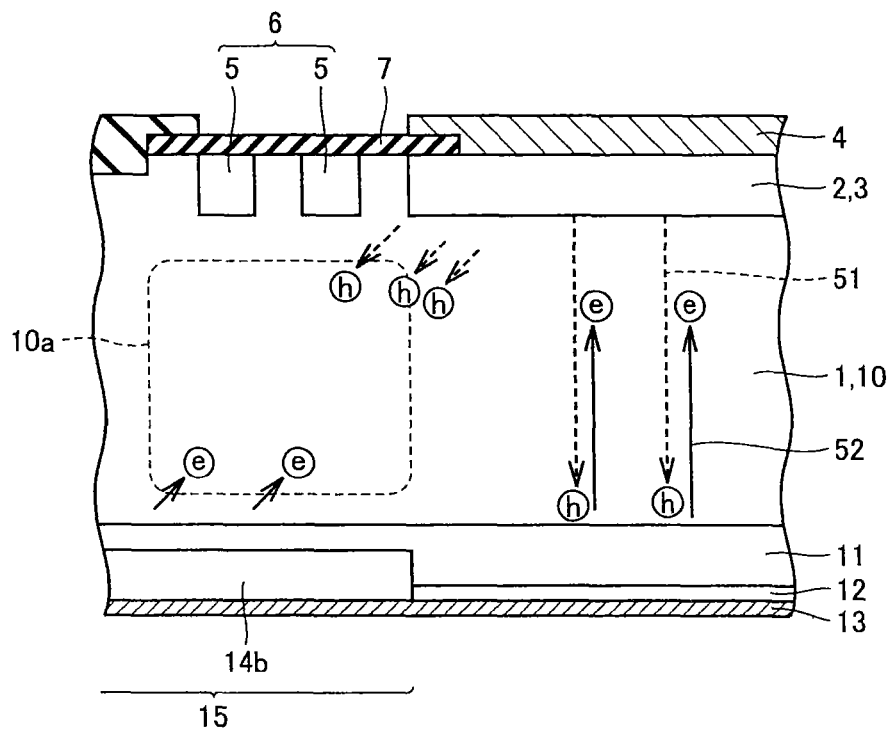
FIGS. 17 and 18 are cross sections respectively showing a first state and a second state for illustrating an operation of the semiconductor device in the embodiment.
Figure 18:
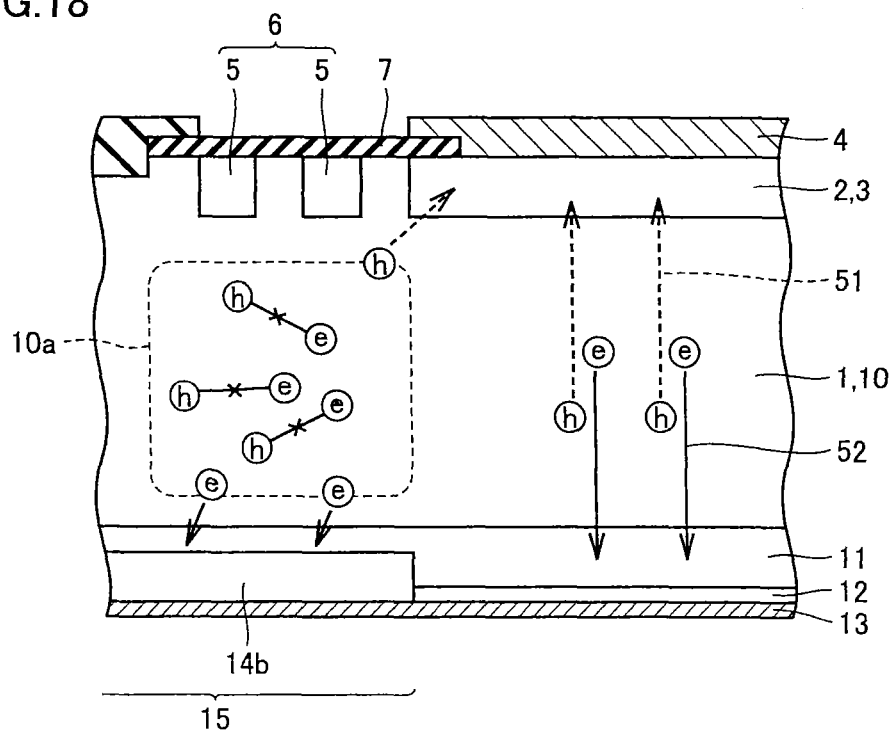

A description will now be given of an operation of the above-described semiconductor device. First, as shown in FIG. 17, in the ON state of the diode, holes are injected from p-type diffusion region 3 toward drift layer 10 of semiconductor substrate 1, while electrons are injected from n-type ultrahigh-concentration impurity layer 12 and n-type high-concentration impurity layer 11 toward drift layer 10 of semiconductor substrate 1. Next, as shown in FIG. 18, at the OFF time, the carriers accumulated in drift layer 10 are discharged from cathode electrode 13 or anode electrode 4, for example, and disappear in the end.

In the above-described semiconductor device, since cathode-side p-type diffusion region 14b is formed in guard-ring opposed region 15, the volume (electron concentration) of the n-type region is decreased so that the carriers accumulated in region 10a of the drift layer 10 immediately under guard ring 6 in the ON state can be decreased. Further, as shown in FIG. 18, since the heavy metal is diffused in cathode-side p-type diffusion region 14b, the diffused heavy metal serves as a center of recombination at the OFF time when the change from the ON state to the OFF state occurs, so that the ratio of accumulated electrons and holes recombined at the center of recombination to disappear is increased.

Accordingly, the carriers flowing from region 10a of the drift layer 10 immediately under guard ring 6 into an outer peripheral end portion of p-type diffusion region 3 in close proximity to guard ring 6 further decrease. As a result, concentration of the current (reverse recovery current) on the outer peripheral end portion of p-type diffusion region 3 can be surely suppressed to improve the breakdown tolerance.

Here, the heavy metal can be diffused in cathode-side diffusion region 14b by performing appropriate heat treatment after the heavy metal is supplied into the cathode-side p-type diffusion region by the sputtering or vapor deposition method using an oxide film mask for example.

Fifth Embodiment

Figure 19:
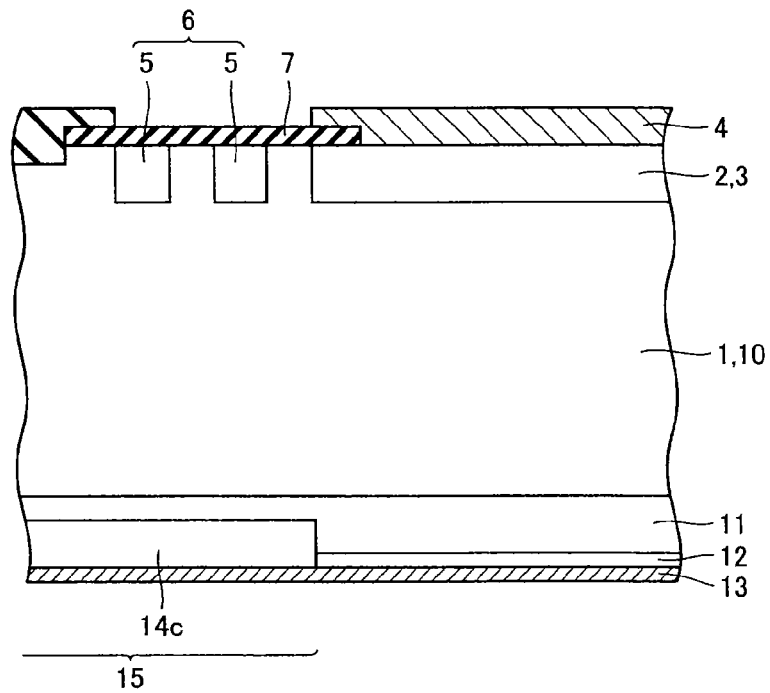
FIG. 19 is a cross section of a semiconductor device according to a fifth embodiment of the present invention.

Here, a description will be given of another example of the semiconductor device for locally shortening the lifetime of carriers. As shown in FIG. 19, in guard-ring opposed region 15 of the cathode, a cathode-side p-type diffusion region 14c irradiated selectively with electron beam, proton or helium is formed. This semiconductor device is similar to the semiconductor device shown in FIG. 1 except for this feature. Therefore, like components are denoted by like reference characters and the description thereof will not be repeated.

Figure 20:
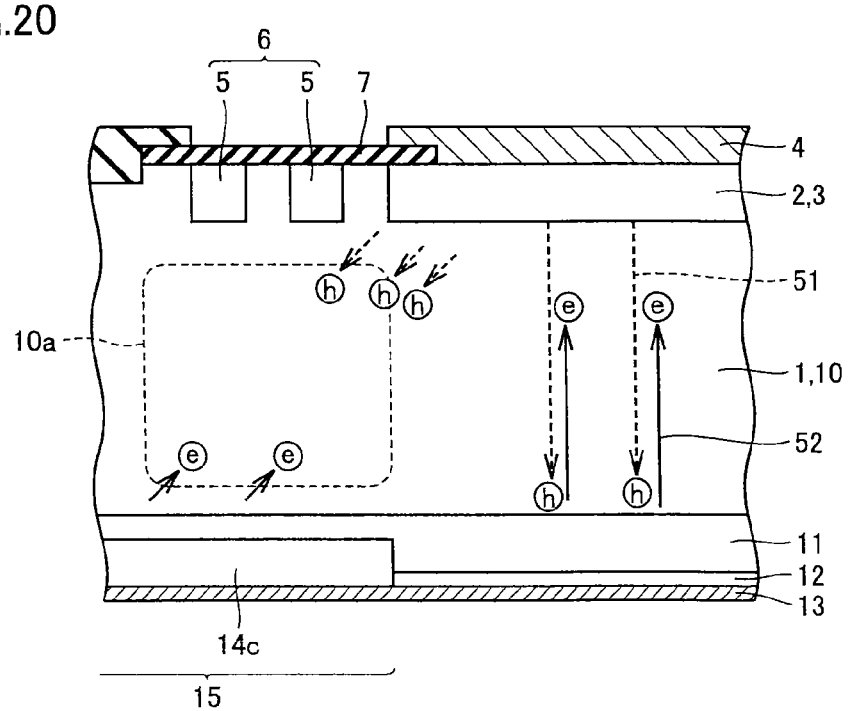
FIGS. 20 and 21 are cross sections respectively showing a first state and a second state for illustrating an operation of the semiconductor device in the embodiment.
Figure 21:
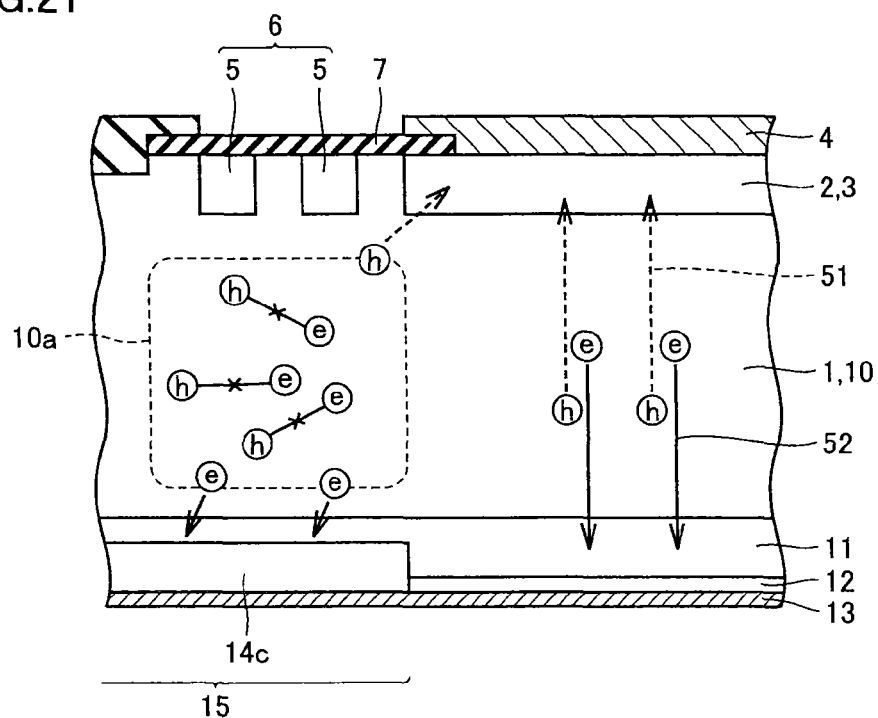

A description will now be given of an operation of the above-described semiconductor device. First, as shown in FIG. 20, in the ON state of the diode, holes are injected from p-type diffusion region 3 toward drift layer 10 of semiconductor substrate 1, while electrons are injected from n-type ultrahigh-concentration impurity layer 12 and n-type high-concentration impurity layer 11 toward drift layer 10 of semiconductor substrate 1. Then, as shown in FIG. 21, at the OFF time, the carriers accumulated in drift layer 10 is discharged from cathode electrode 13 or anode electrode 4, for example, and disappear in the end.

In the above-described semiconductor device, cathode-side p-type diffusion region 14c is formed in guard-ring opposed region 15, and thus the volume (electron concentration) of the n-type region is decreased. Thus the carries accumulated in region 10a of the drift layer immediately under guard ring 6 in the ON state can be decreased. Further, as shown in FIG. 21, since a crystal defect is generated due to the irradiation of cathode-side diffusion region 14c with electron beam for example, the crystal defect serves as a center of recombination at the OFF time when the change from the ON state to the OFF state occurs, so that the ratio of accumulated electrons and holes recombined at the center of recombination to disappear increases.

Accordingly, at the OFF time, carriers flowing from region 10a of the drift layer immediately under guard ring 6 into an outer peripheral end portion of p-type diffusion region 3 in close proximity to guard ring 6 further decrease. As a result, concentration of the current (reverse recovery current) on the outer peripheral end portion of p-type diffusion region 3 can surely be suppressed to improve the breakdown tolerance.

Sixth Embodiment

Figure 22:
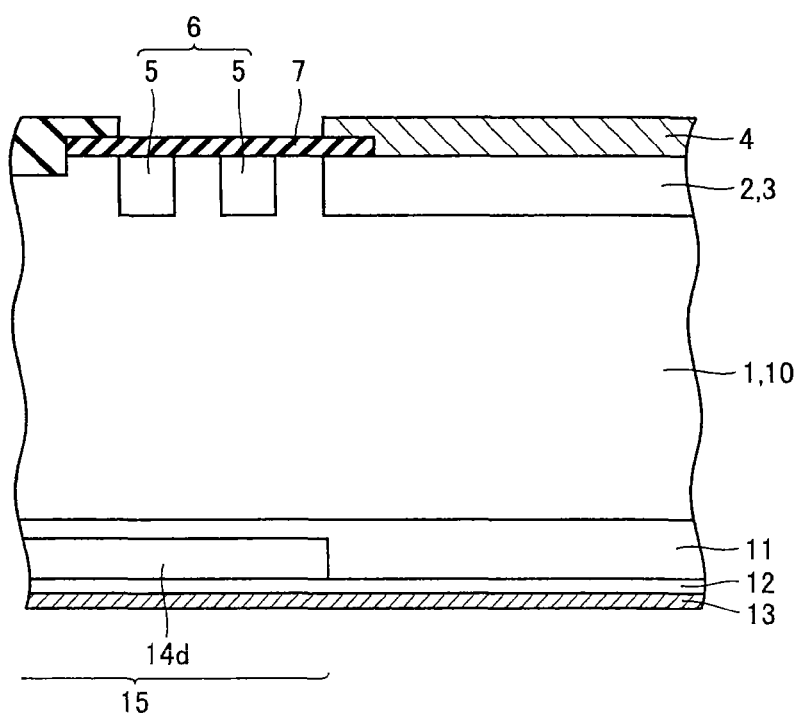
FIG. 22 is a cross section of a semiconductor device according to a sixth embodiment of the present invention.

The above-described semiconductor devices have been explained in connection with the example where the cathode-side p-type diffusion region is electrically connected to the cathode electrode. Here, a description will be given of the case where the cathode-side p-type diffusion region is electrically floating with respect to the cathode electrode. As shown in FIG. 22, n-type ultrahigh-concentration impurity layer 12 is located between cathode electrode 13 and a cathode-side p-type diffusion region 14d formed in guard-ring opposed region 15 in the cathode, and thus cathode-side p-type diffusion region 14d is electrically floating with respect to cathode electrode 13. This semiconductor device is similar to the semiconductor device shown in FIG. 1 except for this feature. Therefore, like components are denoted by like reference characters and the description thereof will not be repeated.

A description will now be given of an operation of the above-described semiconductor device. Even in the case where cathode-side p-type diffusion region 14d is electrically floating with respect to cathode electrode 13, the operation is substantially identical to the operation in the case where the cathode-side p-type diffusion region is electrically connected to the cathode electrode.

Figure 23:
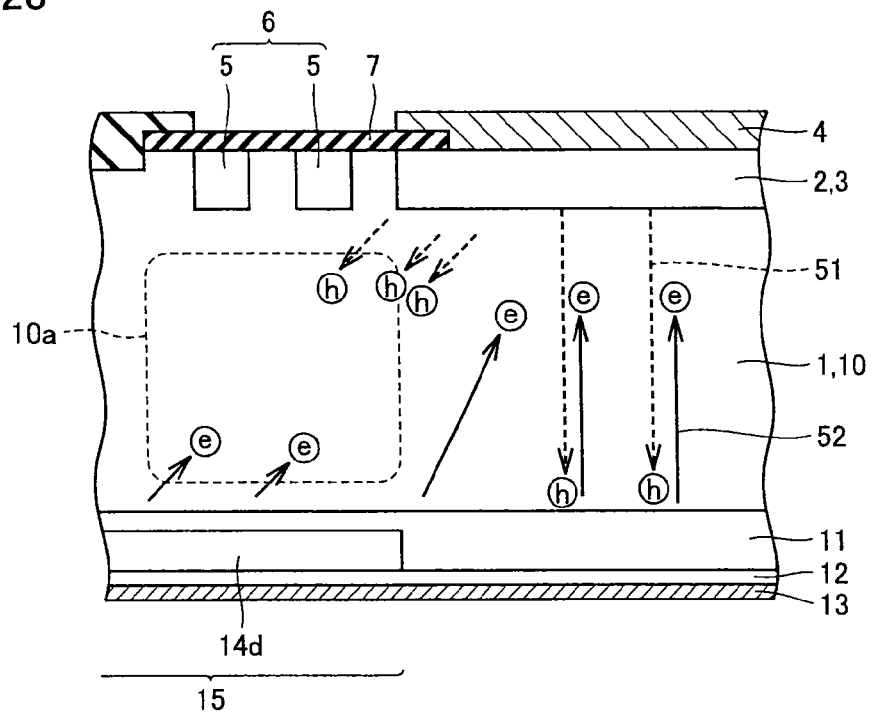
FIGS. 23 and 24 are cross sections respectively showing a first state and a second state for illustrating an operation of the semiconductor device in the embodiment.
Figure 24:
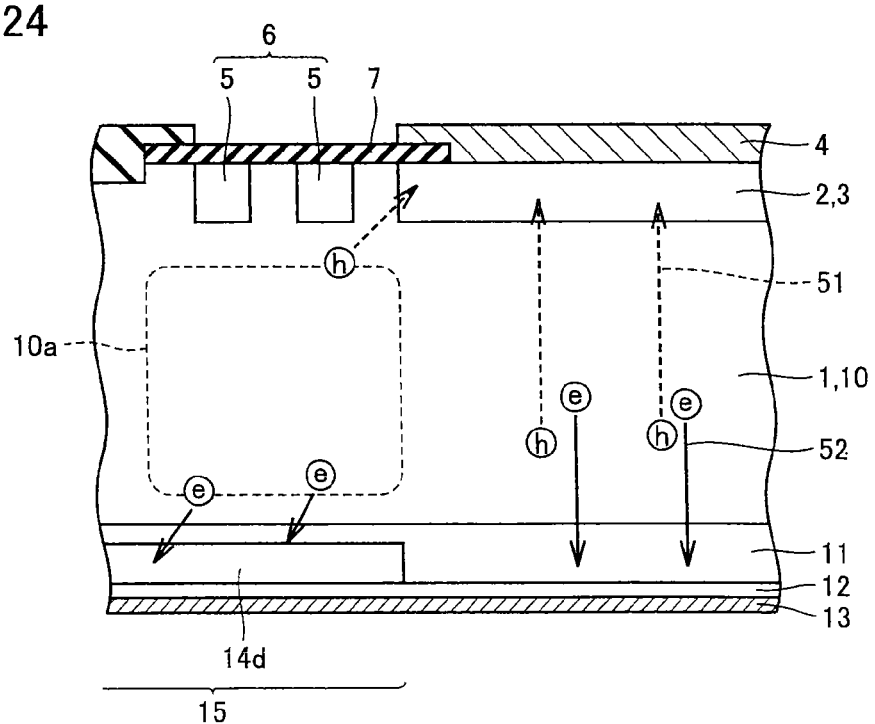

First, as shown in FIG. 23, in the ON state of the diode, holes are injected from p-type diffusion region 3 toward drift layer 10 of semiconductor substrate 1, while electrons are injected from n-type ultrahigh-concentration impurity layer 12 and n-type high-concentration impurity layer 11 toward drift layer 10 of semiconductor substrate 1. Then, as shown in FIG. 24, at the OFF time, the carriers accumulated in drift layer 10 are discharged from cathode electrode 13 or anode electrode 4, for example, and disappear in the end.

In the above-described semiconductor device, since cathode-side p-type diffusion region 14d is formed in the guard-ring opposed region, the volume (electron concentration) of the n-type region is decreased, so that the carriers accumulated in region 10a of the drift layer immediately under guard ring 6 in the ON state can be decreased. Accordingly, the carriers flowing from region 10a of the drift layer into an outer peripheral end portion of p-type diffusion region 3 in close proximity to guard ring 6 at the OFF time decrease. As a result, concentration of the current (reverse recovery current) on the outer peripheral end portion of p-type diffusion region 3 can be suppressed to improve the breakdown tolerance.

Further, in the above-described semiconductor device, since cathode-side p-type diffusion region 14d is electrically floating with respect to cathode electrode 13, any manufacturing method different from the one in the case where cathode-side p-type diffusion region 14d is connected to cathode electrode 13 can be used and thus variations of the manufacturing method are increased. Specifically, this structure can be formed in the following way. First, the n-type high-impurity-concentration layer is formed. Then, impurities are injected for forming the cathode-side p-type diffusion region. Then, heat treatment is performed to thermally diffuse the impurities to form the cathode-side p-type diffusion region. Then, the n-type ultrahigh-impurity-concentration layer is formed.

Furthermore, in the above-described semiconductor device, since n-type ultrahigh-impurity-concentration layer 12 is formed over the whole of the other main surface of semiconductor substrate 1, the contact resistance between the other main surface and cathode electrode 13 can be reduced.

Seventh Embodiment

Figure 25:
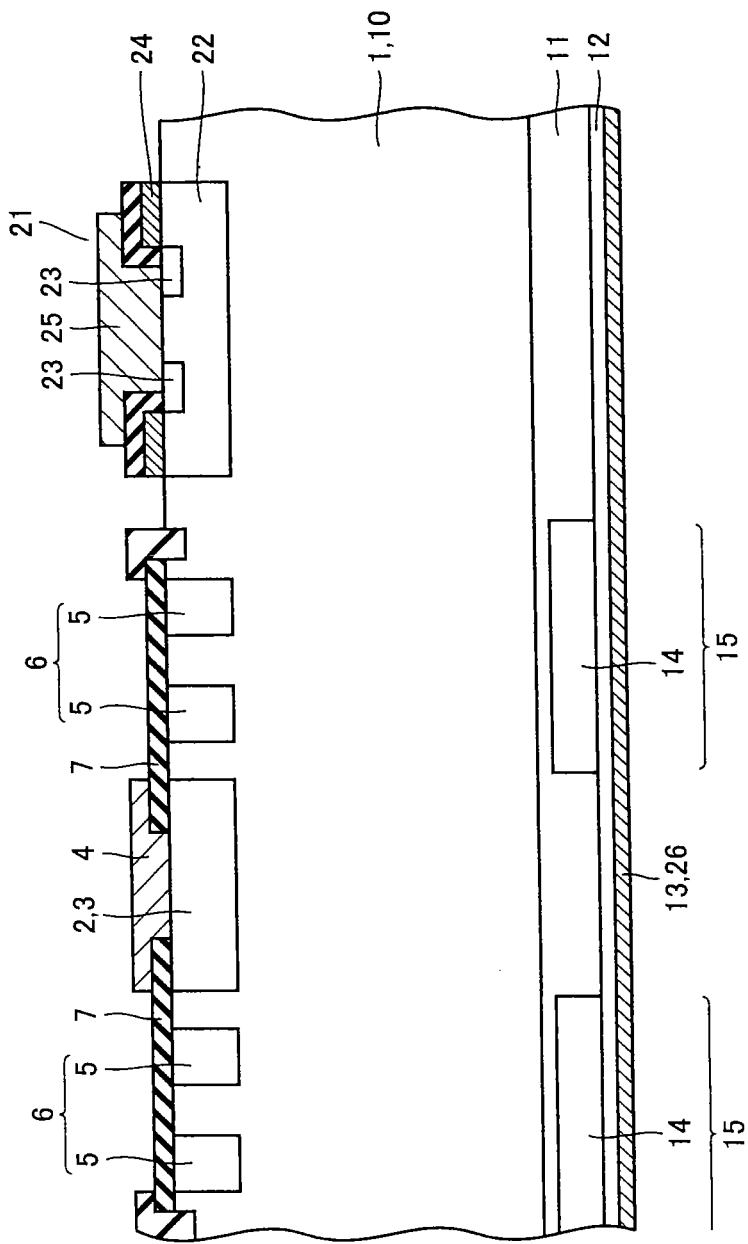
FIG. 25 is a cross section of a semiconductor device according to a seventh embodiment of the present invention.

Here, a description will be given of a semiconductor device having a semiconductor substrate where a diode is formed and additionally a MOSFET (Metal Oxide Semiconductor Field Effect Transistor) is formed. As shown in FIG. 25, on one main surface side of semiconductor substrate 1, MOSFET 21 is formed at a distance from the anode of the diode.

In MOSFET 21, a p-type diffusion region 22 is formed from the main surface of semiconductor substrate 1 to a predetermined depth. In p-type diffusion region 22, an n-type diffusion region 23 is formed. On p-type diffusion region 22, a gate electrode 24 and a source electrode 25 are formed. On the other main surface of semiconductor substrate 1, electrodes 13, 26 serving as both of a cathode electrode and a drain electrode are formed. This semiconductor device is similar to the already-described semiconductor device except for the above-described feature. Therefore, like components are denoted by like reference characters and the description thereof will not be repeated.

Figure 26:
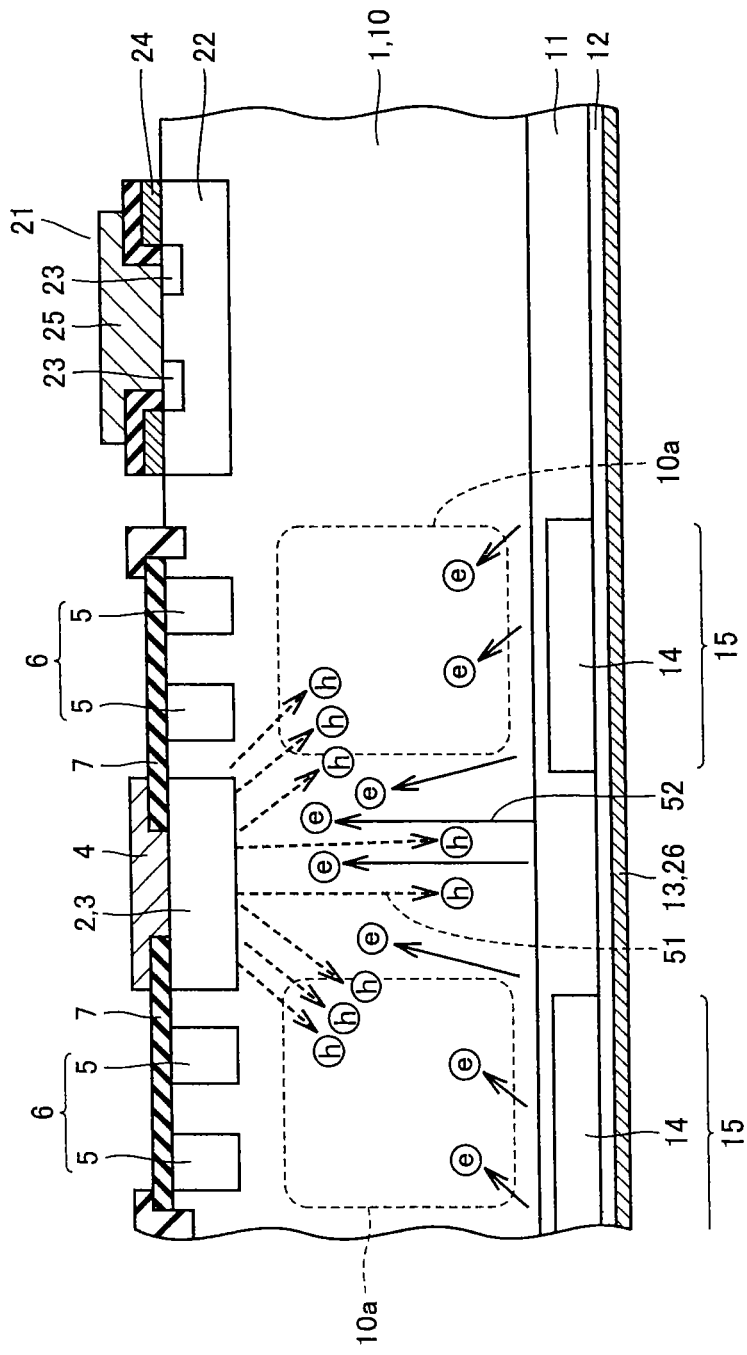

Regarding the diode of the above-described semiconductor device, cathode-side p-type diffusion region 14 is formed in guard-ring opposed region 15 of the cathode, so that the volume (electron concentration) of the n-type region is decreased and, as shown in FIG. 26, the carriers accumulated in region 10a of the drift layer immediately under guard ring 6 in the ON state can be decreased, as described above. Accordingly, as shown in FIG. 27, at the OFF time when a change from the ON state to the OFF state occurs, carriers flowing from region 10a of the drift layer immediately under guard ring 6 into an outer peripheral end portion of p-type diffusion region 3 in close proximity to guard ring 6 decrease. As a result, concentration of the current (reverse recovery current) on the outer peripheral end portion of p-type diffusion region 3 can be suppressed to improve the breakdown tolerance.

This semiconductor device provides the following effect in addition to the above-described effect. Specifically, the diode and the MOSFET are formed at the same semiconductor substrate, so that the productivity can be improved and the assembly process can be simplified.

In order to avoid imbalance between the electric field and the electric current, it is preferable that cathode-side p-type diffusion regions 14 to 14d of respective semiconductor devices of the above-described embodiments are each formed with the same shape (such as width and depth) over the whole periphery in guard-ring opposed region 15 located opposite to guard ring 6. Further, since concentration of the current on the outer peripheral end portion of the anode is suppressed, the lifetime of the semiconductor device can be prolonged and the energy can be saved. Moreover, the prolonged lifetime can lessen the load on the environment.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A semiconductor device including a diode, comprising:
   a semiconductor substrate of a first conductivity type having a first main surface and a second main surface opposite to each other;
   an anode of a second conductivity type formed on said first main surface side of said semiconductor substrate;
   a guard ring formed at a distance from said anode and surrounding said anode;
   a cathode including a high-concentration impurity layer of the first conductivity type formed on said second main surface side of said semiconductor substrate;
   a cathode-side impurity region of the second conductivity type formed in a region located in said cathode and opposite to said guard ring;
   a cathode electrode connected to said cathode;
   an ultrahigh-concentration impurity region located between said cathode electrode and said cathode-side impurity region;
   said cathode-side impurity region is electrically floating with respect to said cathode electrode; and
   said cathode-side impurity region extends continuously in a direction away from a region facing said anode and does not extend to be opposite said anode, and forms an interface with the high-concentration impurity layer of the cathode.

2. The semiconductor device according to claim 1, wherein said cathode-side impurity region forms an interface with said ultrahigh-concentration impurity region, and said ultrahigh-concentration impurity region forms an interface with said cathode electrode opposite the interface between said cathode-side impurity region and said ultrahigh-concentration impurity region.

3. The semiconductor device according to claim 1, wherein the ultrahigh-concentration impurity region extends continuously from the region facing the anode to another region opposite to the guard ring.

\* \* \* \* \*